US006525268B1

(12) United States Patent
Sellers

(10) Patent No.: US 6,525,268 B1
(45) Date of Patent: Feb. 25, 2003

(54) SYSTEM AND METHOD FOR HOUSING ELECTRONIC DEVICES

(76) Inventor: Holly A. Sellers, 15 Crandell Ct., Springboro, OH (US) 45066

( * ) Notice: Subject to any disclaimer, the term of this patent is extended or adjusted under 35 U.S.C. 154(b) by 0 days.

(21) Appl. No.: 09/675,868

(22) Filed: Sep. 29, 2000

(51) Int. Cl.[7] .......................... H01L 23/02
(52) U.S. Cl. .................... 174/52.1; 211/26.1; 206/701; 361/807; 361/810
(58) Field of Search .................... 174/52.1; 361/679, 361/807, 809, 810; 211/13.1, 26.1; 206/320, 701; 5/636, 639, 644, 645, 490

(56) References Cited

U.S. PATENT DOCUMENTS 3,863,283 A 2/1975 Mohr
3,946,316 A 3/1976 Hough
4,116,310 A * 9/1978 Shields .................... 190/42
4,309,784 A 1/1982 Cohen
4,359,494 A * 11/1982 Hosaka .................... 428/15
D275,436 S 9/1984 Zierdan
4,660,792 A 4/1987 Rogalski
4,688,286 A 8/1987 Miker, Jr.
4,733,776 A * 3/1988 Ward .................... 206/305
4,749,604 A 6/1988 Foster
4,824,059 A * 4/1989 Butler .................... 248/176
4,873,736 A 10/1989 Sapp
5,168,590 A 12/1992 O'Sullivan
5,195,634 A 3/1993 Zaug
5,305,980 A 4/1994 LeBlanc
5,495,301 A 2/1996 Mudra
D368,095 S * 3/1996 McCallister, III .......... D14/218
5,499,417 A 3/1996 Wang
5,502,513 A 3/1996 Mudra
D378,020 S * 2/1997 Hatt .................... D3/218
5,605,235 A 2/1997 Johnson
5,692,608 A * 12/1997 Simien .................... 206/320
5,819,346 A 10/1998 Lane
5,872,702 A * 2/1999 Kopel .................... 361/810
5,898,962 A * 5/1999 McNeal .................... 5/639
6,008,736 A 12/1999 Palm et al.
6,216,297 B1 * 4/2001 Lemke .................... 5/636

* cited by examiner

*Primary Examiner*—Dean A. Reichard
*Assistant Examiner*—Carmelo Oliva
(74) *Attorney, Agent, or Firm*—Jacox, Meckstroth & Jenkins

(57) ABSTRACT

A carrier houses a plurality of electronic devices, such as remote control devices. The carrier includes at least one or a plurality of compartments for receiving one or more remote control devices. The carrier has a transparent cover on at least one side thereof to permit the remote control devices to be visually accessed and operated. The cover also comprises a decorative pattern, such as a floral pattern.

50 Claims, 4 Drawing Sheets

SYSTEM AND METHOD FOR HOUSING ELECTRONIC DEVICES

BACKGROUND OF THE INVENTION

1. Field of the Invention

This invention relates to a system and method for housing electronic devices and, more particularly, a pillow for receiving a plurality of electronic devices, such as remote control devices, so that they can be easily located.

2. Description of the Related Art

In today's society, people have become accustomed to using many electronic devices, such as televisions, video cassette recorders, stereos, receivers, computers, radios and the like. It is not uncommon that these devices have an associated remote control device, commonly referred to as a "clicker." The remote control devices enable an operator to remotely control the electronic devices while the operator is situated some distance from the device.

Unfortunately, it can become frustrating when the devices become lost, such as when they are stuck inside or underneath a couch or chair. Exacerbating this problem is the fact that, with the advance of technology, these devices have become smaller and smaller, thereby making it much easier to lose the remote control devices.

What is needed, therefore, is a simple and convenient system and method for facilitating locating a device and also for housing one or more devices together so that they can easily be accessed and used.

SUMMARY OF THE INVENTION

It is, therefore, a primary object of the invention to provide a convenient system and method for housing at least one electronic device, such as a remote control unit, for controlling a second electronic device.

It is another object of the invention to provide a system and method for housing a plurality of remote control devices in a carrier, such as a pillow, whereby all remote control devices may be housed in one single carrier.

It is a further object of the invention to provide a pillow for housing one or more remote control devices and also for permitting visual access to the remote control devices, while simultaneously permitting an operator to see and actuate the remote control devices while in the pillow or carrier.

In one aspect, this invention comprises a pillow comprising: a cover; a core; and at least one receiving area for removably receiving at least one electronic device for controlling at least one second electronic device; the cover permitting the at least one electronic device to be actuated to remotely control the at least one second electronic device, without having to remove the at least one electronic device from the pillow.

In another aspect, this invention comprises a pillow comprising: cover; receiving means situated inside the cover for removably receiving at least one electronic device for controlling at least one second electronic device; the cover permitting the at least one electronic device to be actuated to remotely control the at least one second electronic device, without having to remove the at least one electronic device from the pillow.

In still another aspect, this invention comprises a method for facilitating locating an electronic component comprising the steps of: providing a pillow comprising a cover having a core, the pillow comprising at least one receiving area for removably receiving at least one electronic device for controlling at least one second electronic device; the cover permitting the at least one electronic device to be visibly actuated to remotely control the at least one second electronic device, without having to remove the at least one electronic device from the pillow.

Other objects and advantages of the invention will be apparent from the following description, the accompanying drawings and the appended claims.

DETAILED DESCRIPTION OF THE INVENTION

Referring now to the figures, a system and method for facilitating reducing or eliminating the loss of at least one electronic device, such as a remote control device for a television, video cassette recorder, compact disc player, receiver, tuner or other remote control device, will now be described. In the embodiment being described, the system comprises a carrier or pillow 10 comprising a cover 12 having a first side 12A and a second side 12B. The cover 12 may be assembled from strips of material that are sewn, glued, banded or welded together or it may be comprised of a single tubular section (not shown) or plurality of plies which are secured or adhered together. The cover 12 may be made of fabric, artificial material, a polymer or other man-made material (not shown). In the embodiment being described, the side 12A has at least a portion which is transparent so that a remote control device 14 can be visually observed and operated with the cover thereon without the need for removing the device 14 from the pillow 10. It should be appreciated that the cover 12 permits at least one electronic device 14 to be actuated to remotely control at least one second electronic device (not shown), such as a television, video cassette recorder or any other electronic device having an associated remote control. In the embodiment being described, at least one electronic device may comprise or be selected from the group consisting of a television remote control, a receiver remote control, a computer remote control or any infrared (IR) remote control device or mixtures thereof. In one embodiment, the second side 12B of the cover 12 may comprise a decorative pattern and may be manufactured from any suitable material or fabric, such as a tapestry having, for example, a floral pattern. Also, it should be understood that the cover 12A is of a thickness (e.g., less than ⅛ inch) that will permit an operator to easily and manually actuate the buttons on the remote control devices 20A–20C.

Figure 1:
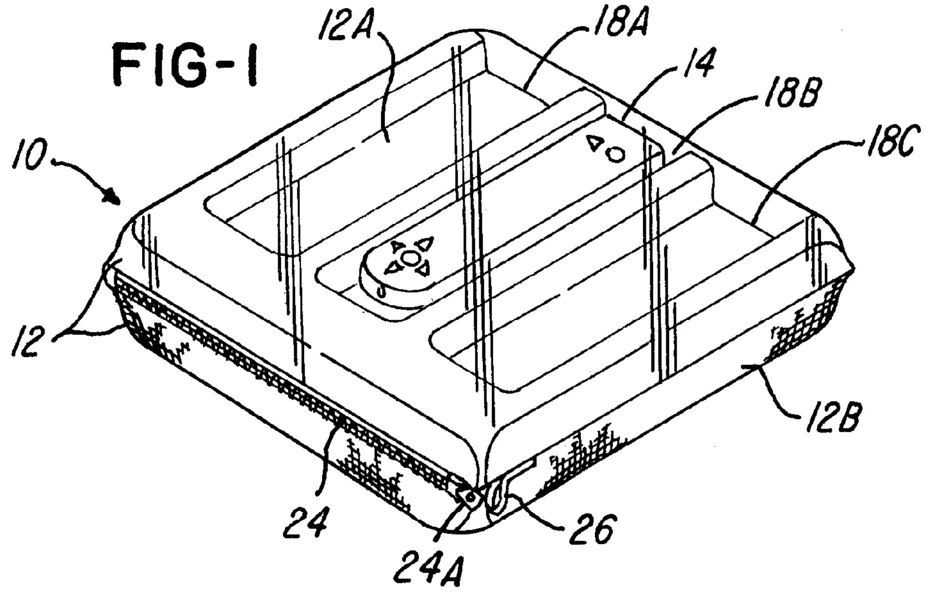
FIG. 1 is a perspective view of an embodiment of the invention.
Figure 4A:
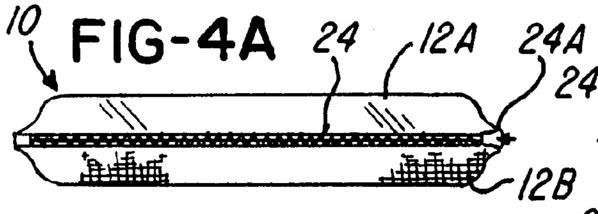
FIGS. 4A–4D are various side views of the embodiment shown in FIGS. 1 and 2A.
Figure 4B:
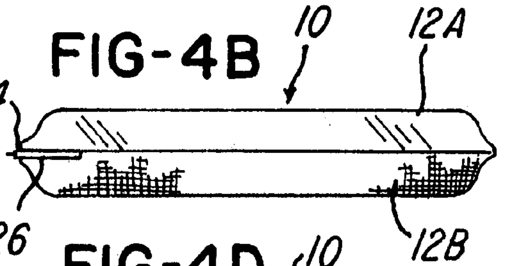
Figure 4C:
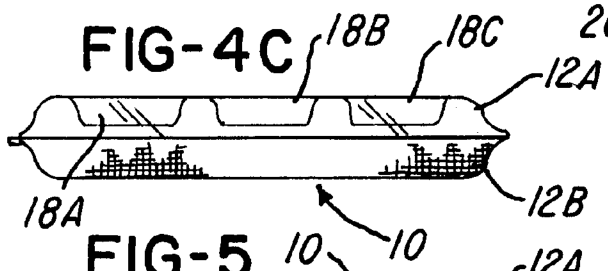
Figure 4D:
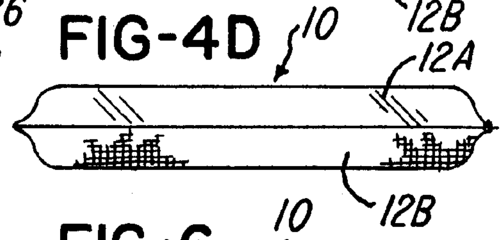
Figure 5:
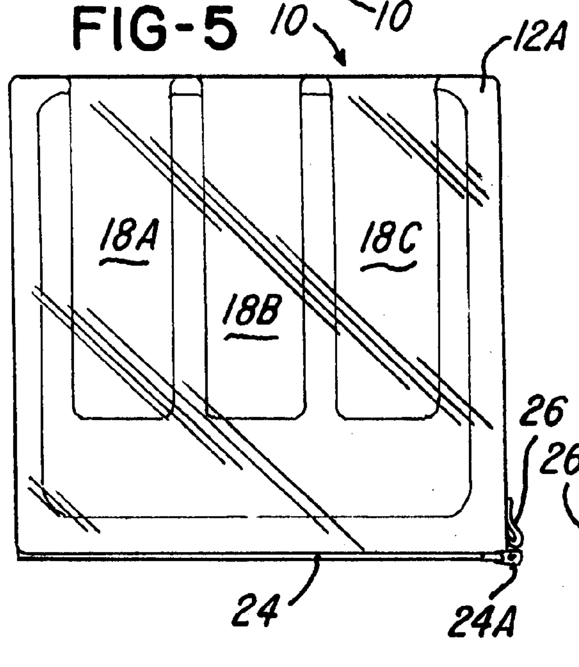
FIG. 5 is a top view of the embodiment shown in FIGS. 1 and 2A.
Figure 6:
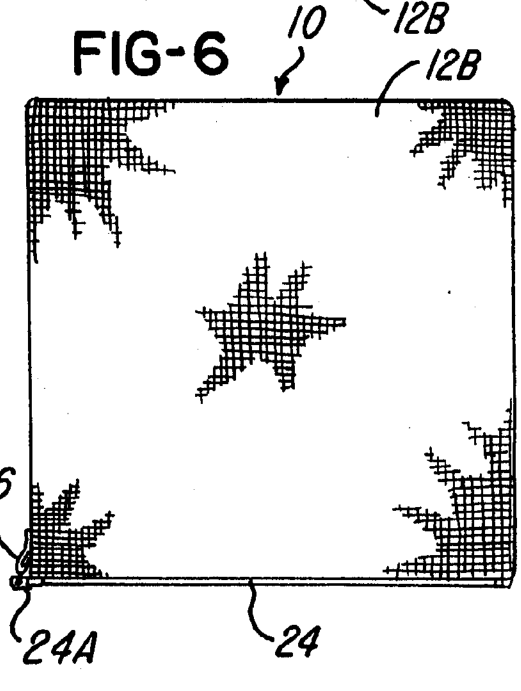
FIG. 6 is a rear view of the embodiment shown in FIGS. 1 and 2A.
Figure 2A:
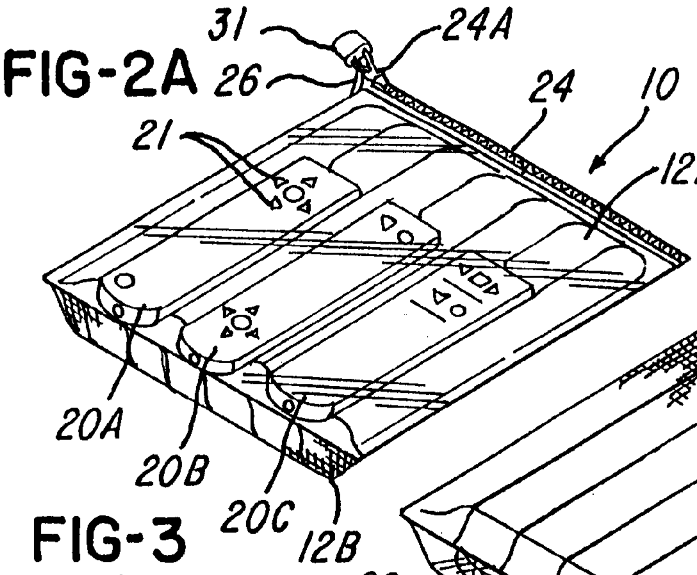
FIG. 2A is another view of the invention shown in FIG. 1, illustrating a plurality of remote control devices situated in a carrier.
Figure 2B:
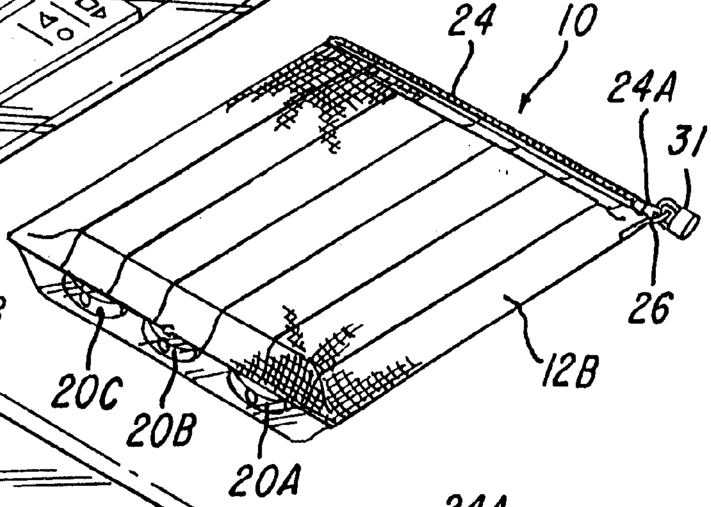
FIG. 2B is a view of a rear side of the embodiment shown in FIG. 2A.
Figure 3:
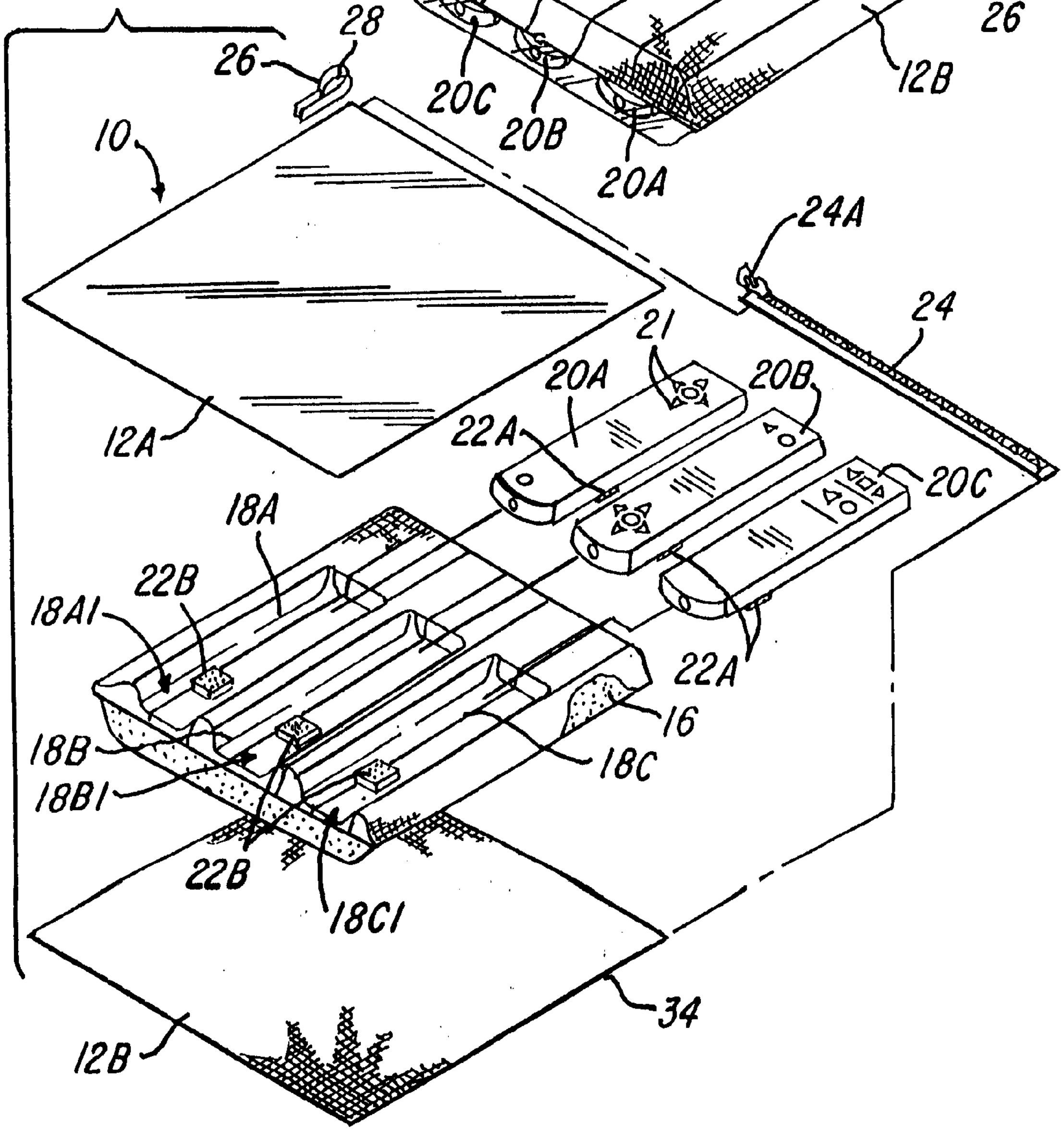
FIG. 3 is an exploded view of the embodiment shown in FIG. 2A.
Figure 7:
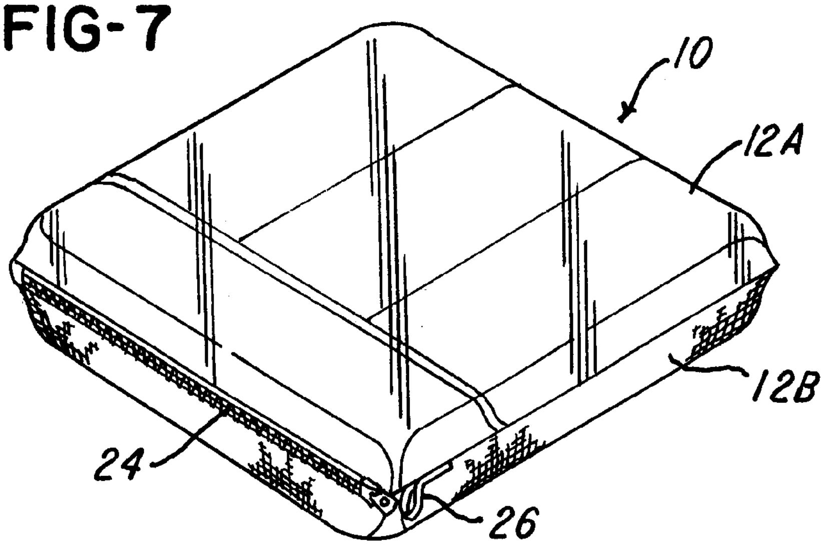
FIG. 7 is a perspective view of another embodiment of the invention.
Figure 8A:
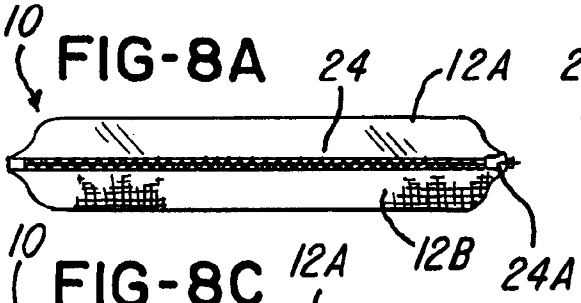
FIGS. 8A–8D are various side views of the embodiment shown in FIG. 7.
Figure 8B:
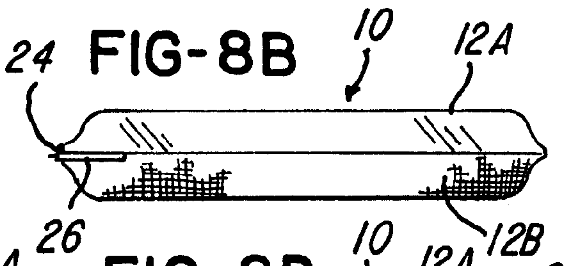
Figure 8C:
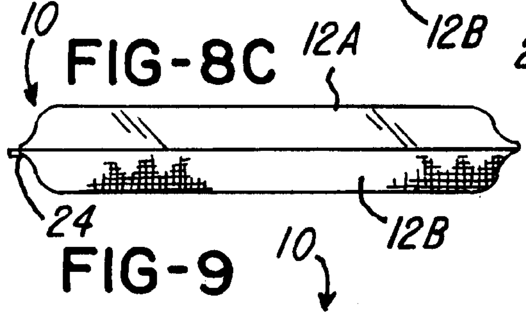
Figure 8D:
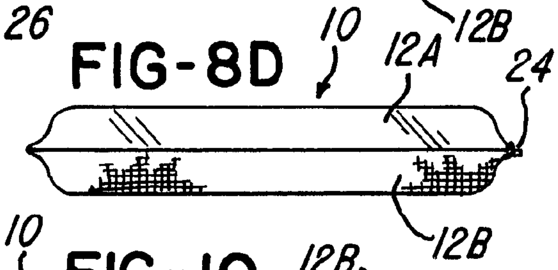
Figure 9:
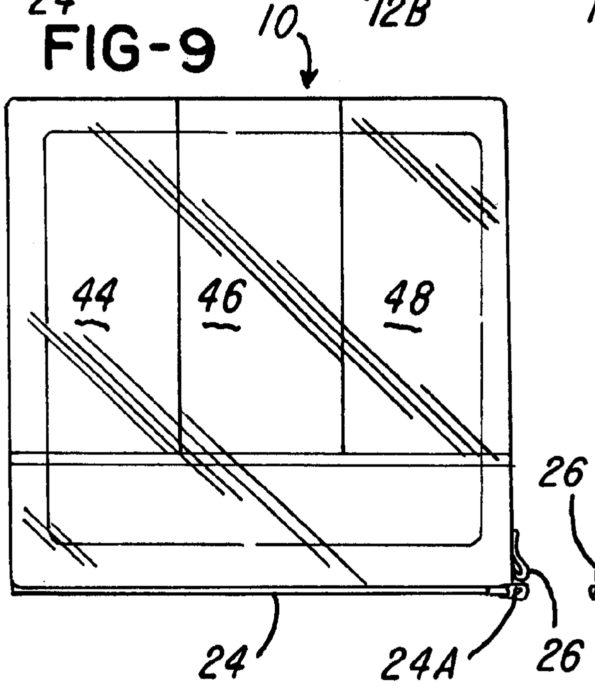
FIG. 9 is a top view of the embodiment shown in FIG. 7.
Figure 10:
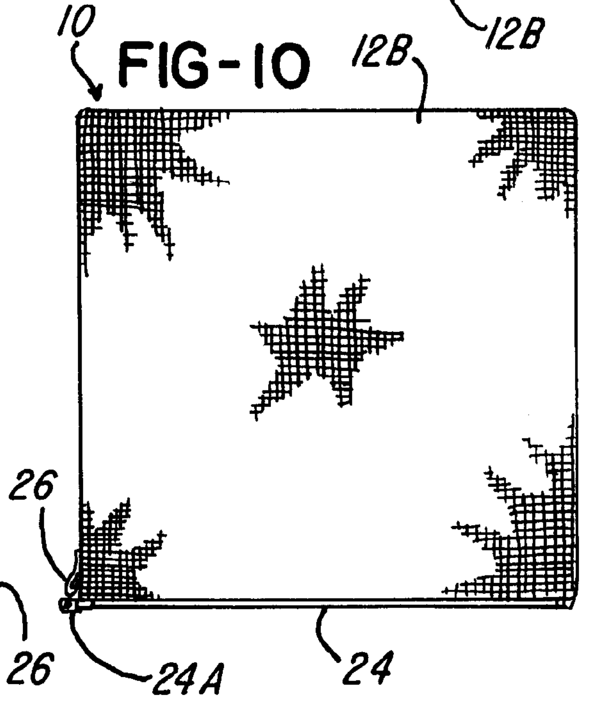
FIG. 10 is a bottom or rear view of the embodiment shown in FIG. 7.
Figure 11:
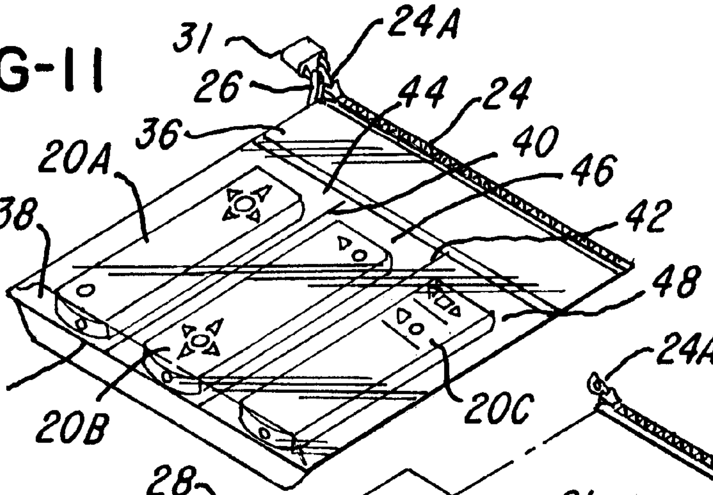
FIG. 11 is a perspective view of the embodiment shown in FIG. 7 illustrating a plurality of remote control devices situated in a carrier or pillow.
Figure 12:
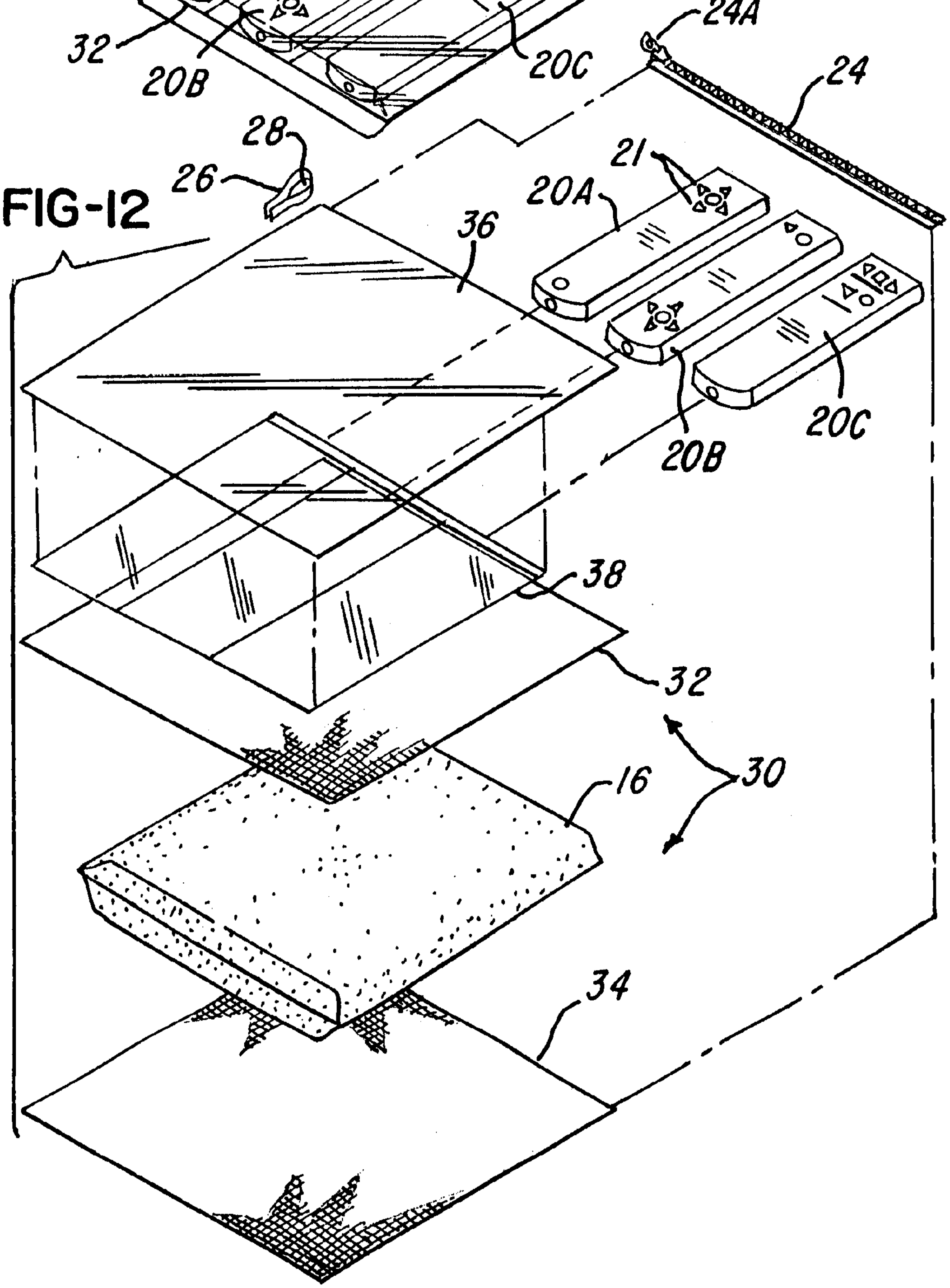
FIG. 12 is an exploded view of the embodiment shown in FIGS. 7 and 11.

As best illustrated in FIGS. 1–4A, the pillow 10 further comprises a core 16, which in the embodiment being described is a pre-formed foam core, having a plurality of receiving means or recessed areas 18A–18C for receiving a plurality of remote control devices 20A–20C respectively. As best illustrated in FIG. 3, the receiving areas 18A–18C are generally rectangular, but could be configured so as to complement the shape of the devices which they receive.

As best illustrated in FIG. 3, the pillow 10 may comprise at least one securer or securing means for locking or securing the remote control devices 20A–20C in their respective receiving areas 18A–18C respectively. In one embodiment, the securing means or securer comprises Velcro® strips 22A and 22B which cooperate to lock or secure the remote control devices 20A–20C in their respective receiving areas 18A–18C, respectively. Although not shown, the securing means or securer may include one or more elastic straps (not shown) associated with each of the receiving areas 18A–18C for securing the remote control devices 20A–20C in their respective receiving areas 18A–18C. In the embodiment being described, note that the plurality of receiving areas 18A–18C each have an end area 18A1–18C1 which is open to permit an IR signal or other type of signal to be communicated between the remote control devices 20A–20C and their respective electronic devices (not shown).

In the embodiment being described and as illustrated in FIGS. 1, 2A–2B and 3, it should be appreciated that the pillow 10 comprises a zipper 24 having a gripping portion 24A. In the embodiment being described, the pillow 10 comprises locking means or a lock comprising a loop 26 defining an aperture 28 for receiving the zipper portion 24A. After the zipper portion 24A is received in the aperture 28, it may be fastened on the zipper portion 24A as shown in order to retain the zipper 24 in the locked position. This facilitates preventing the zippers from opening and also preventing, for example, young children from removing the remote control devices 20A–20C from their receiving areas 18A–18C, respectively.

In the embodiment being described, the pillow 10 comprises dimensions smaller than 16 inches by 16 inches by 6 inches for a total area of 256 inches and total volume of 1536 inches, but each dimension could be larger or smaller if desired. For example, it is envisioned that at least a portion of a sleeping pillow (not shown) could comprise the system described herein.

FIGS. 7–15 illustrates another embodiment of the invention with those parts which are the same or similar to the parts identified in FIGS. 1–6 having the same part numbers. In this embodiment, the foam core 16 does not comprise the receiving areas 18A–18C. Rather, the receiving areas 18A–18C are defined by configuration of the cover 30. In the embodiment being described, the cover 30 comprises a first side 32 and a second side 34, with both sides 32 and 34 defining a decorative, colored or other pattern thereon. A plurality of sheets 36 and 38 are situated on the first side 32. Note the sheets 36 and 38 are transparent plastic sheets which may be hot-welded, bonded, glued, sewn or otherwise secured together to define dividers 40 and 42 (FIG. 11) which define a plurality of compartments 44–48 which receive the remote control devices 20A–20C as shown.

A method for facilitating locating an electronic component, such as lost remote control device 20A–20C, will now be described. First, a carrier or pillow 10, such as one or more of the pillows shown in FIGS. 1–12, is provided. At least one remote control device 20A–20C is situated in either the core 16 or receiving areas 18A–18C of the embodiment in FIG. 3 or the compartments 44–48 defined by cover 30 of the pillow 10 illustrated in FIGS. 9–11.

If desired, after the zipper is actuated to a closed position (shown in FIG. 1), the zipper portion 24A may be received in the aperture 28 of loop 26 and the lock 31 placed thereon. This facilitates preventing, for example, children from removing the remote control devices 20A–20C from the pillow 10.

Advantageously, this system and method provides convenient means for reducing or eliminating the loss of remote control devices by encasing the remote control devices in a relatively large carrier or pillow 10 so that the devices are readily visible and locatable by the location of the pillow 10. An operator can use the remote control devices 20A–20C by pointing them at their associated electronic device and then actuating the buttons, such as button 21 in FIG. 2A, to control the second electronic device. Conveniently, the transparent cover 12A provides visual access to the remote control device 20A–20C so that the operator can actuate the various buttons of the remote control devices 20A–20C. When not in use, the pillow may function in a traditional manner as a pillow, decoration or any suitable and/or traditional means for which a pillow may be used.

Also, it should be appreciated that while the embodiments shown in FIGS. 1–16 illustrate 3 compartments or receiving areas, the pillow 10 may be provided with only one or a plurality of compartments for receiving one or more remote control devices. Also, it is envisioned that one or more of the devices 20A–20C or other devices may be received in a single receiving area if desired.

While the method and form of apparatus herein described constitute preferred embodiments of this invention, it is to be understood that the invention is not limited to these precise forms of method and apparatus, and that changes may be made therein without departing from the scope of the invention which is defined in the appended claims.

What is claimed is:

1. A pillow comprising:

a cover;

a core having first and second halves; and at least two receiving areas in said second half of said core, each of said receiving areas for removably receiving at least one electronic device for controlling at least one second electronic device;

a first side of said cover adjacent said first half of said core comprising a decorative pattern and a second side of said cover adjacent said second half of said core permitting at least one button on at least one electronic device to be actuated by a user to remotely control the at least one second electronic device, without having to remove the at least one electronic device from the pillow;

said core providing a cushion so that said first side may be used as a pillow.

2. The pillow as recited in claim 1 wherein the removable receiving area is defined by the core.

3. The pillow as recited in claim 2 wherein the core is foam.

4. The pillow as recited in claim 3 wherein the at least one receiving area is generally rectangular.

5. The pillow as recited in claim wherein at least a portion of the cover is transparent to facilitate seeing and operating the at least one electronic device.

6. The pillow as recited in claim 5 wherein the second side comprises a pattern.

7. The pillow as recited in claim 4 wherein the cover defines said first side and a second side, at least a portion of the second side being transparent to facilitate seeing and operating the at least one electronic device.

8. The pillow as recited in claim 3 wherein the at least one rectangular area comprises three receiving areas.

9. The pillow as recited in claim 2 wherein the at least one receiving area comprises a plurality of receiving areas each capable of receiving the at least one electronic device selected from the group consisting essentially of: a television remote control, a receiver remote control, a computer remote control, other IR remote control or mixtures of one or more thereof.

10. The pillow as recited in claim 6 wherein the pillow having dimensions defining a volume of less than 1534 cubic inches.

11. The pillow as recited in claim 1 wherein the at least one receiving area is defined by at least one pocket in the cover.

12. The pillow as recited in claim 11 wherein the at least one pocket comprises a plurality of receiving areas each capable of receiving the at least one electronic device selected from the group consisting essentially of: a television remote control, a receiver remote control, a computer remote control, other IR remote control or mixtures of one or more thereof.

13. The pillow as recited in claim 1 wherein the at least one receiving area comprises a securer for securing the at least one electronic device in the at least one receiving area.

14. The pillow as recited in claim 13 wherein the securer comprises Velcro®.

15. The pillow as recited in claim 13 wherein the securer comprises a strap.

16. The pillow as recited in claim 1 wherein the at least one electronic device is selected from the group consisting essentially of: a television remote control, a receiver remote control, a computer remote control, an IR remote control or mixtures thereof.

17. A pillow comprising:

a cover;

a core; and at least one receiving area for removably receiving at least one electronic device for controlling at least one second electronic device;

a first side of said cover comprising a decorative pattern and a second side of said cover permitting at least one button on at least one electronic device to be actuated by a user to remotely control the at least one second electronic device, without having to remove the at least one electronic device from the pillow;

said core providing a cushion so that said first side may be used as a pillow; and said cover providing a lock for locking the at least one electronic device inside the pillow.

18. A pillow comprising:

a cover;

a core; and at least one receiving area for removably receiving at least one electronic device for controlling at least one second electronic device;

the cover permitting the at least one electronic device to be actuated to remotely control the at least one second electronic device, without having to remove the at least one electronic device from the pillow;

wherein the pillow comprises a lock for locking the at least one electronic device inside the pillow; and wherein the pillow comprises a zipper, the pillow having a loop for receiving the zipper so that the lock can be secured thereto in order to lock the pillow.

19. A pillow comprising:

a cover having a decorative pattern on at least a first side of said pillow;

a core having first and second halves;

receiving means comprising at least two receiving areas associated with a second side of said pillow adjacent said second half of said core and inside the cover, each of said receiving areas for removably receiving at least one electronic device for controlling at least one second electronic device;

said cover permitting the at least one electronic device to be actuated to remotely control the at least one second electronic device, without having to remove the at least one electronic device from the pillow, said first side being suitable for use as a cushion.

20. The pillow as recited in claim 19 wherein the pillow comprises a lock for locking the at least one electronic device inside the pillow.

21. The pillow as recited in claim 19 wherein the receiving means comprises a core comprising at least one receiving area situated inside the pillow for receiving the at least one electronic device.

22. The pillow as recited in claim 21 wherein the core comprises a foam core defining the at least one receiving area.

23. The pillow as recited in claim 21 wherein the at least one receiving area comprises a plurality of receiving area each capable of receiving the at least one electronic device selected from the group consisting essentially of: a television remote control, a receiver remote control, a computer remote control, other IR remote control or mixtures of one or more thereof.

24. The pillow as recited in claim 19 wherein the receiving means comprises the cover comprising a transparent sleeve defining the at least one receiving area.

25. The pillow as recited in claim 24 wherein the at least one rectangular area comprises three receiving areas.

26. The pillow as recited in claim 24 wherein the cover defines a first side and a second side, at least a portion of the first side being transparent to facilitate seeing and operating the at least one electronic device.

27. The pillow as recited in claim 26 wherein the front side comprises a floral pattern.

28. The pillow as recited in claim 19 wherein at least a portion of the second side is transparent to facilitate seeing and operating the at least one electronic device.

29. The pillow as recited in claim 19 wherein the at least one receiving area comprises a securer for securing the at least one electronic device in the at least one receiving area.

30. The pillow as recited in claim 29 wherein the securer comprises Velcro®.

31. The pillow as recited in claim 29 wherein the securer comprises a strap.

32. The pillow as recited in claim 19 wherein the at least one electronic device is selected from the group consisting essentially of: a television remote control, a receiver remote control, a computer remote control, an IR remote control or mixtures thereof.

33. A pillow comprising:

a cover;

receiving means situated inside the cover for removably receiving at least one electronic device for controlling at least one second electronic device;

the cover permitting the at least one electronic device to be actuated to remotely control the at least one second electronic device, without having to remove the at least one electronic device from the pillow;

wherein the pillow comprises a lock for locking the at least one electronic device inside the pillow; and wherein the pillow comprises a zipper, the pillow having a loop for receiving the zipper so that the lock can be secured thereto in order to lock the pillow.

34. A method for facilitating locating an electronic component comprising the steps of:

providing a carrier comprising a cover situated over a core having first and second halves, said carrier comprising at least two receiving areas adjacent said second half of said core, each of said receiving areas for removably receiving at least one electronic device for controlling at least one second electronic device;

said cover defining at least one first side adjacent said first half of said core that comprises a decorative pattern and at least one second side of said cover adjacent said second half of said core that permits said at least one electronic device to be visibly actuated to remotely control the at least one second electronic device, without having to remove the at least one electronic device from the carrier.

35. The method as recited in claim 34 wherein the method further comprises the step of:

providing the carrier in the form of a pillow with a lock for locking the at least one electronic device inside the pillow.

36. The method as recited in claim 34 wherein the at least one receiving area is defined by the core.

37. The method as recited in claim 36 wherein the core is foam.

38. The method as recited in claim 36 wherein the at least one receiving area is generally rectangular.

39. The method as recited in claim 36 wherein the method further comprises the step of:

providing the cover defining said at least one first side and said second side, at least a portion of the at least one second side being transparent to facilitate seeing and operating the at least one electronic device.

40. The method as recited in claim 36 wherein the at least one receiving area comprises a plurality of receiving areas each capable of receiving the at least one electronic device selected from the group consisting essentially of: a television remote control, a receiver remote control, a computer remote control, other IR remote control or mixtures of one or more thereof.

41. The method as recited in claim 40 wherein the carrier having dimensions defining an area of less than 256 square inches.

42. The method as recited in claim 34 wherein the at least one receiving area comprises three receiving areas.

43. The method as recited in claim 34 wherein the method further comprises the step of providing the cover comprising at least one pocket in the cover.

44. The method as recited in claim 34 wherein the method further comprises the step of:

providing the cover defining said at least one first side and said at least one second side, at least a portion of the at least one second side being transparent to facilitate seeing and operating the at least one electronic device.

45. The method as recited in claim 44 wherein the second side comprises a floral pattern.

46. The method as recited in claim 34 wherein the at least one receiving area comprises a securer associated therewith for securing the at least one electronic device in the at least one receiving area.

47. The method as recited in claim 46 wherein the securer comprises Velcro®.

48. The method as recited in claim 46 wherein the securer comprises an elastic strap.

49. The method as recited in claim 34 wherein the at least one electronic device is selected from the group consisting essentially of: a television remote control, a receiver remote control, a computer remote control, an IR remote control or mixtures thereof.

50. A method for facilitating locating an electronic component comprising the steps of:

providing a carrier comprising a cover having a core, the carrier comprising at least one receiving area for removably receiving at least one electronic device for controlling at least one second electronic device;

the cover permitting the at least one electronic device to be visibly actuated to remotely control the at least one second electronic device, without having to remove the at least one electronic device from the carrier;

wherein the method further comprises the step of:

providing the carrier in the form of a pillow with a lock for locking the at least one electronic device inside the pillow;

wherein the method further comprises the step of:

providing a loop on the pillow for receiving a zipper so that the lock can be secured thereto in order to lock the pillow.

* * * * *